(12) United States Patent
Tilton

(10) Patent No.: US 7,490,478 B1
(45) Date of Patent: *Feb. 17, 2009

(54) DYNAMIC SPRAY SYSTEM

(75) Inventor: Charles L. Tilton, Colton, WA (US)

(73) Assignee: Isothermal Systems Research, Inc., Liberty Lake, WA (US)

( * ) Notice: Subject to any disclaimer, the term of this patent is extended or adjusted under 35 U.S.C. 154(b) by 289 days.

This patent is subject to a terminal disclaimer.

(21) Appl. No.: 11/142,902

(22) Filed: May 31, 2005

Related U.S. Application Data

(60) Continuation of application No. 11/107,350, filed on Apr. 14, 2005, now abandoned, which is a division of application No. 10/280,240, filed on Oct. 22, 2002, now Pat. No. 6,880,350, which is a continuation-in-part of application No. 10/243,683, filed on Sep. 13, 2002, now Pat. No. 6,857,283.

(51) Int. Cl.
*F28D 3/00* (2006.01)
*F28D 5/00* (2006.01)
*F28C 1/00* (2006.01)

(52) U.S. Cl. .......................... 62/171; 62/259.2; 62/121; 62/310

(58) Field of Classification Search ............ 62/171, 62/304, 310, 259.2, 121
See application file for complete search history.

(56) References Cited

U.S. PATENT DOCUMENTS

| | | | | |
|---|---|---|---|---|
| 3,930,619 A * | 1/1976 | Levey et al. | ............... | 239/526 |
| 5,707,010 A * | 1/1998 | Manfre et al. | ............... | 239/296 |
| 6,484,521 B2 * | 11/2002 | Patel et al. | .................... | 62/171 |
| 6,625,023 B1 * | 9/2003 | Morrow et al. | ............. | 361/700 |
| 6,880,350 B2 * | 4/2005 | Tilton | ........................ | 62/171 |
| 7,021,067 B1 * | 4/2006 | Tilton et al. | .................... | 62/121 |
| 2002/0112491 A1 * | 8/2002 | Malone et al. | ............... | 62/171 |
| 2002/0163782 A1 * | 11/2002 | Cole et al. | ................. | 361/700 |
| 2003/0155434 A1 * | 8/2003 | Rini et al. | ................... | 239/398 |
| 2003/0177774 A1 * | 9/2003 | Malone et al. | ............... | 62/171 |

* cited by examiner

*Primary Examiner*—William C Doerrler
(74) *Attorney, Agent, or Firm*—Michael S. Neustel

(57) ABSTRACT

A dynamic spray system for effectively thermally managing electronic components. The dynamic spray system includes a thermal management system including a spray unit, and a control unit in communication with the thermal management system. The spray unit includes a spray head and an atomizer within the spray head for dispensing a continuous coolant spray having a spray characteristic. The control unit delivers an electrical signal to the spray unit dependent upon feedback data received from the thermal management system, wherein the electrical signal controls the spray unit to adjust the spray characteristic of the continuous coolant spray.

18 Claims, 10 Drawing Sheets

DYNAMIC SPRAY SYSTEM

CROSS REFERENCE TO RELATED APPLICATIONS

I hereby claim benefit under Title 35, United States Code, Section 120 of the following United States patent applications:
1. Ser. No. 11/107,350 filed Apr. 14, 2005 now abandoned;
2. Ser. No. 10/280,240 filed on Oct. 22, 2002 now U.S. Pat. No. 6,880,350; and
3. Ser. No. 10/243,683 filed Sep. 13, 2002 now U.S. Pat. No. 6,857,283.

This application is a continuation of the 11/107,350 application, filed Apr. 14, 2005, now abandoned, which is a divisional of the Ser. No. 10/280,240 application, filed Oct. 22, 2002, now U.S. Pat. No. 6,880,350, which is a continuation-in-part of the Ser. No. 10/243,683 application, filed Sep. 13, 2002, now U.S. Pat. No. 6,857,283. The Ser. No. 11/107,350 application Ser. No. 10/243,683 application and Ser. No. 10/280,240 application are hereby incorporated by reference into this application.

STATEMENT REGARDING FEDERALLY SPONSORED RESEARCH OR DEVELOPMENT

Not applicable to this application.

BACKGROUND OF THE INVENTION

1. Field of the Invention

The present invention relates generally to thermal management systems and more specifically it relates to a dynamic spray system for applying a dynamic fluid spray to a surface and for thermally managing electronic components.

2. Description of the Related Art

Thermal management systems for electronic devices have been in use for years in applications such as but not limited to semiconductor burn-in and electronic component cooling. It is an objective of silicon device manufacturers to minimize burn-in time and simultaneously maintain the junction temperatures of the batch of devices under burn-in to be within a narrow range. Conventional thermal management systems utilized today are comprised of, for example, either air-cooled enclosures, or fluid-cooled cold plates. Upcoming technologies include refrigeration systems or other phase change based technologies.

When producing semiconductors, manufacturers typically perform three different tests on the semiconductors prior to shipping: (1) sort, (2) burn-in, and (3) class testing. Sort test requires maintaining the wafers at a modest temperature, e.g. 35° Celsius, while the wafers are probed for defects. Conventional fluid-cooled cold plates are employed at this stage. Projected heat fluxes, even at the wafer sort, are pointing to the fact that a more effective thermal management technology is needed at this stage.

Burn-in of the semiconductors is typically accomplished utilizing elevated voltages and temperatures in a process that raises the junction temperatures of a batch of semiconductors. The lifespan of a semiconductor is closely related to its operating temperature wherein operating under increased temperatures reduces the effective lifespan of the semiconductor. By applying increased voltages and temperatures to a semiconductor, the weaker semiconductors will fail during testing. The length of the burn-in of semiconductors is directly tied to the median junction temperature of the batch of semiconductors. It is therefore important to maintain a relatively narrow junction temperature spread that provides a higher median temperature. For example, a poor thermal management system can produce a junction temperature spread from 75° to 125° Celsius resulting in a low median junction temperature, longer burn-in time and higher associated burn-in costs. Modern fluid-based thermal management systems are currently able to lower the junction temperature spread to approximately 95° to 110° Celsius thereby reducing burn-in time and burn-in costs.

Class test is the final step in the testing process and is comprised of a final series of tests to validate functionality and quantify speeds. During class test, non-uniform heating of the semiconductors typically occurs. A semiconductor's speed is typically derated by 0.15% for every degree Celsius rise above the target temperature function temperature, Tj). It is therefore important to maintain the temperature of the semiconductors relatively close to the target temperature (Tj).

Due to increasing chip heat fluxes (projected to exceed 125 $W/cm^2$ by the year 2004), conventional thermal management systems for semiconductor burn-in are reaching their cooling limits. A further problem with conventional thermal management systems is that they are inefficient, complex, costly to implement and costly to operate. A further problem with conventional thermal management systems is that the resulting junction temperature spreads result in relatively long burn-in times of the semiconductor devices. Another problem with conventional thermal management systems is that they require significant amounts of power to operate.

Examples of patented devices which may be related to the present invention include U.S. Pat. No. 5,579,826 to Hamilton et al.; U.S. Pat. No. 5,582,235 to Hamilton et al.; U.S. Pat. No. 5,515,910 to Hamilton et al.; U.S. Pat. No. 5,359,285 to Hashinaga et al.; U.S. Pat. No. 6,389,225 to Malinoski et al.; U.S. Pat. No. 6,114,868 to Nevill; U.S. Pat. No. 5,461,328 to Devereaux et al.; U.S. Pat. No. 6,181,143 to Ghoshal; U.S. Pat. No. 6,288,371 to Hamilton et al.; U.S. Pat. No. 5,532,610 to Tsujide et al.; U.S. Pat. No. 6,307,388 to Friedrich et al.; U.S. Pat. No. 6,175,498 to Conroy et al.; U.S. Pat. No. 6,359,456 to Hembree et al.; U.S. Pat. No. 5,541,524 to Tuckerman et al.; U.S. Pat. No. 5,220,804 to Tilton et al.; U.S. Pat. No. 6,016,969 to Tilton et al.; U.S. Pat. No. 6,108,201 to Tilton et al.; U.S. Pat. No. 6,104,610 to Tilton et al.; U.S. Pat. No. 5,880,931 to Tilton et al.; U.S. Pat. No. 5,933,700 to Tilton; U.S. Pat. No. 5,713,327 to Tilton et al.; U.S. Pat. No. 5,860,602 to Tilton et al.; U.S. Pat. No. 5,314,529 to Tilton et al.; U.S. Pat. No. 6,205,799 to Patel et al.; U.S. Pat. No. 6,349,554 to Patel et al.; U.S. Pat. No. 5,380,956 to Loo et al.; U.S. Pat. No. 6,115,251 to Patel et al.; U.S. Pat. No. 6,421,240 to Patel; and U.S. Pat. No. 6,317,326 to Vogel et al. Examples of patent applications filed for devices that may be related to the present invention include U.S. Patent Application 2001/0002541 filed by Patel et al.; U.S. Patent Application 2002/0050144 filed by Patel et al.; and U.S. Patent Application 2001/0050164 filed by Wagner et al.

Hence, the dynamic spray system according to the present invention substantially departs from the conventional concepts and designs of the prior art, and in so doing provides an apparatus primarily developed for the purpose of effectively thermally managing electronic components.

BRIEF SUMMARY OF THE INVENTION

In view of the foregoing disadvantages inherent in the known types of semiconductor burn-in systems now present in the prior art, the present invention provides a new dynamic spray system construction wherein the same can be utilized for effectively thermally managing electronic components.

The general purpose of the present invention, which will be described subsequently in greater detail, is to provide a new dynamic spray system that has many of the advantages of the thermal management and liquid dispersing systems mentioned heretofore and many novel features that result in a new dynamic spray system which is not anticipated, rendered obvious, suggested, or even implied by any of the prior art semiconductor burn-in systems, either alone or in any combination thereof.

To attain this, the present invention generally comprises one or more spray units each having a housing structure, a first portion, a first orifice within said first portion fluidly connected to a swirl chamber, a main jet fluidly connected to the swirl chamber, a plunger movably positioned within the main jet for adjusting fluid flow through the main jet, and at least one swirl inlet fluidly connected to the swirl chamber for generating a fluid swirl effect within the swirl chamber. The main jet is preferably aligned with the first orifice for dispersing a relatively narrow spray pattern from the first orifice when the fluid flow is increased through the main jet. The spray pattern size is increased when the fluid flow through the main jet is decreased.

There has thus been outlined, rather broadly, the more important features of the invention in order that the detailed description thereof may be better understood and in order that the present contribution to the art may be better appreciated. There are additional features of the invention that will be described hereinafter and that will form the subject matter of the claims appended hereto.

In this respect, before explaining at least one embodiment of the invention in detail, it is to be understood that the invention is not limited in its application to the details of construction and to the arrangements of the components set forth in the following description or illustrated in the drawings. The invention is capable of other embodiments and of being practiced and carried out in various ways. Also, it is to be understood that the phraseology and terminology employed herein are for the purpose of the description and should not be regarded as limiting.

A primary object of the present invention is to provide a dynamic spray system that will overcome the shortcomings of the prior art devices.

A second object is to provide a dynamic spray system that achieves a minimum junction temperature spread between chips burned-in simultaneously in a batch.

A further object is to provide a dynamic spray system that thermally manages electronic components.

A further object is to provide a dynamic spray system that may be utilized within various applications including but not limited to burn-in thermal management, thermally managing electronic components, and applying a fluid to a surface in a dynamic manner.

Another object is to provide a dynamic spray system that provides an efficient system for adjusting the spray pattern emitted from a spray unit.

An additional object is to provide a dynamic spray system that is energy efficient, flexible and relatively small in size.

A further object is to provide a dynamic spray system that is less costly to implement and operate than conventional thermal management systems.

Another object is to provide a dynamic spray system that reduces testing times of semiconductor devices.

An additional object is to provide a dynamic spray system that transfers heat from a semiconductor using conduction, convection, phase change or a combination thereof.

Another object is to provide a dynamic spray system that works with existing and various types of burn-in equipment currently utilized in the industry.

Another object is to provide a dynamic spray system that is capable of managing the temperature of semiconductors that utilize an integrated heat sink and semiconductors that do not utilize an integrated heat sink.

Other objects and advantages of the present invention will become obvious to the reader and it is intended that these objects and advantages are within the scope of the present invention.

To the accomplishment of the above and related objects, this invention may be embodied in the form illustrated in the accompanying drawings, attention being called to the fact, however, that the drawings are illustrative only, and that changes may be made in the specific construction illustrated and described within the scope of the appended claims.

BRIEF DESCRIPTION OF THE DRAWINGS

Various other objects, features and attendant advantages of the present invention will become fully appreciated as the same becomes better understood when considered in conjunction with the accompanying drawings, in which like reference characters designate the same or similar parts throughout the several views, and wherein.

DETAILED DESCRIPTION OF THE INVENTION

A. Overview

Figure 1:
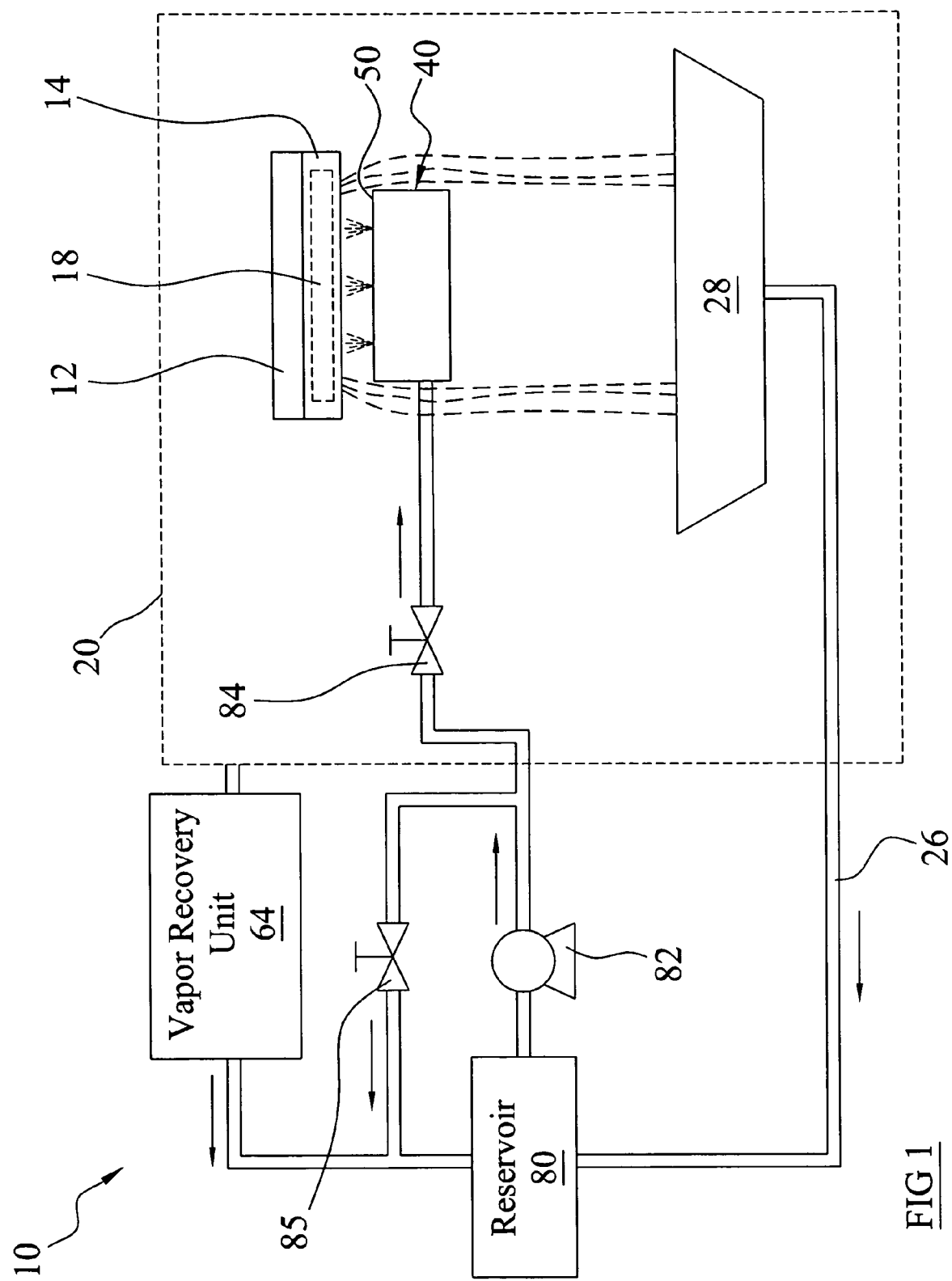
FIG. 1 is a schematic diagram illustrating the overall structure of the present invention.
Figure 2:
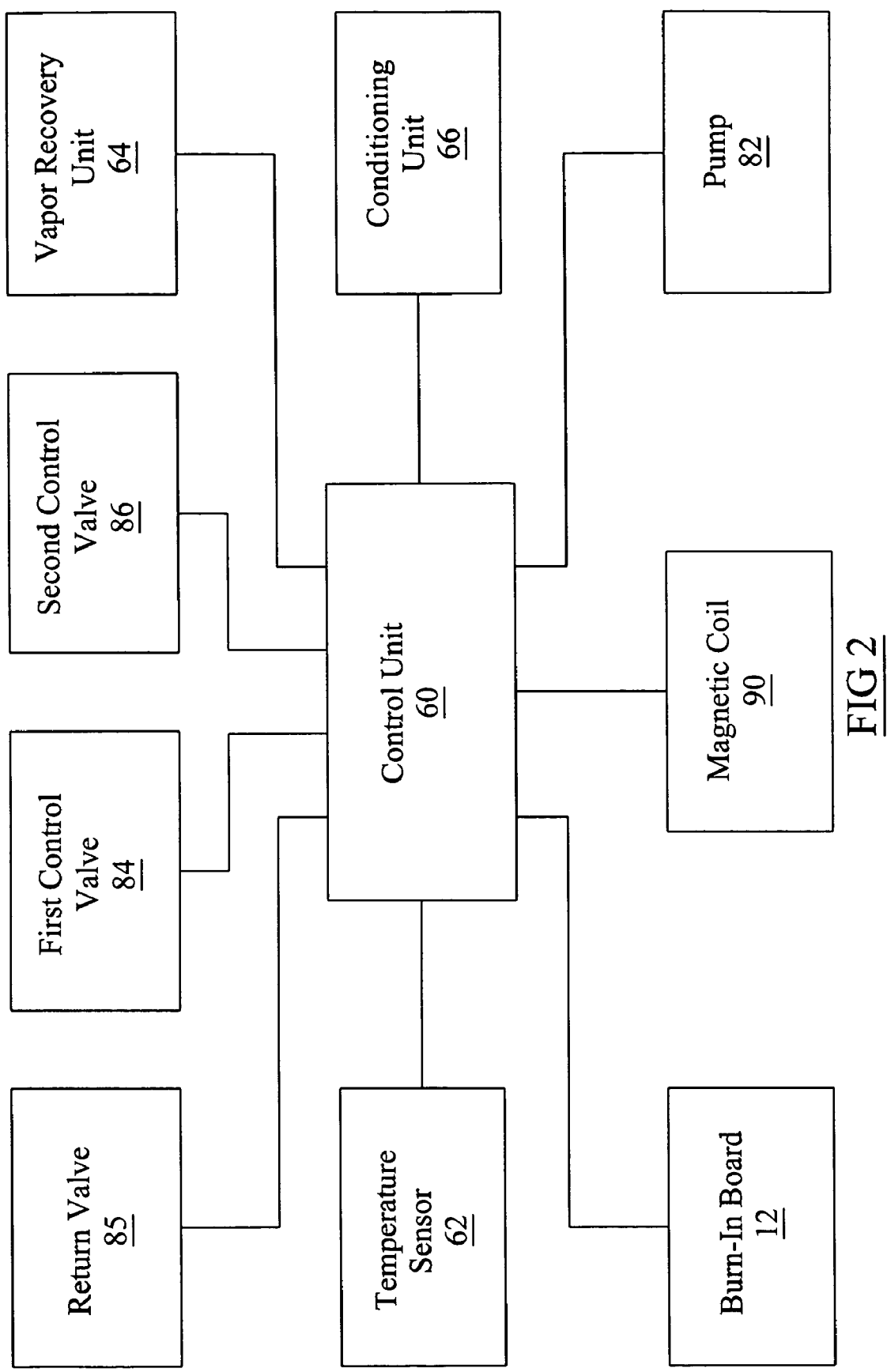
FIG. 2 is a block diagram illustrating the communication connections between the control unit and the related components of the present invention.

Turning now descriptively to the drawings, in which similar reference characters denote similar elements throughout the several views, FIGS. 1 through 12 illustrate a dynamic spray system 10, which comprises one or more spray units 40 each having a housing structure 42, a first portion 50, a first orifice 52 within said first portion 50 fluidly connected to a swirl chamber 30, a main jet 35 fluidly connected to the swirl chamber 30, a plunger 37 movably positioned within the main jet 35 for adjusting fluid flow through the main jet 35, and at least one swirl inlet 32 fluidly connected to the swirl chamber 30 for generating a fluid swirl effect within the swirl chamber 30. The main jet 35 is preferably aligned with the first orifice 52 for dispersing a relatively narrow spray pattern from the first orifice 52 when the fluid flow is increased through the main jet 35. The spray pattern is broadened when the fluid flow through the main jet 35 is decreased.

B. Spray Enclosures

Spray enclosures 20 are known within the semiconductor burn-in industry. A typical spray enclosure 20 has an interior cavity for receiving at least one burn-in board. The spray enclosure 20 may be comprised of any structure capable of housing a burn-in board which are commonly utilized within the burn-in industry or other unit not utilized within the burn-in industry. The spray enclosure 20 preferably has an opening and a door for selectively closing and sealing the opening as is conventional with spray enclosures 20 utilized within the burn-in industry. The spray enclosure 20 preferably has a rail structure or other structure for receiving and supporting one or more burn-in boards 12 in a desired position with respect to the corresponding spray assembly having one or more spray units 40. It can be appreciated that the spray assemblies and the burn-in boards 12 may be stacked within the interior cavity of the spray enclosure 20 depending upon the total number of burn-in boards 12 to be utilized simultaneously. An inlet tube extends into the spray enclosure 20 for providing the fluid to the spray assembly as will be discussed in further detail. An outlet tube extends from the spray enclosure 20 returning the fluid recovered from the spray enclosure 20 to the reservoir 80.

It can be appreciated that the spray enclosure 20 may have various structures and configurations that may be suitable for usage with the present invention. U.S. Pat. No. 5,880,592 provides an exemplary burn-in spray enclosure 20.

C. Burn-In Board

Burn-in boards 12 are also commonly utilized within the burn-in industry. The burn-in board 12 typically includes one or more sockets 14 arranged in a desired pattern. Each of the sockets 14 removably receives, through an opening, a semiconductor 18 to be tested during the burn-in phase. The fluid is sprayed from the spray unit 40 through this opening to engage a surface of the semiconductor 18 contained within the socket 14 for maintaining the desired temperature of the semiconductors 18 within.

The sockets 14 are electrically connectable to the semiconductor 18 inserted within the respective sockets 14. The burn-in board 12 is then electrically coupled to a control unit 60 via a communications port or other structure attached to the burn-in board 12 that controls the test signals sent to each of the semiconductors 18 during the burn-in testing procedure. U.S. Pat. Nos. 6,404,219, 6,181,146 and 5,825,171 illustrate exemplary burn-in devices and burn-in systems which are suitable for usage with the present invention. It can be appreciated that various other burn-in board 12 structures and configurations may be utilized with the present invention.

D. Temperature Sensor

Figure 8:
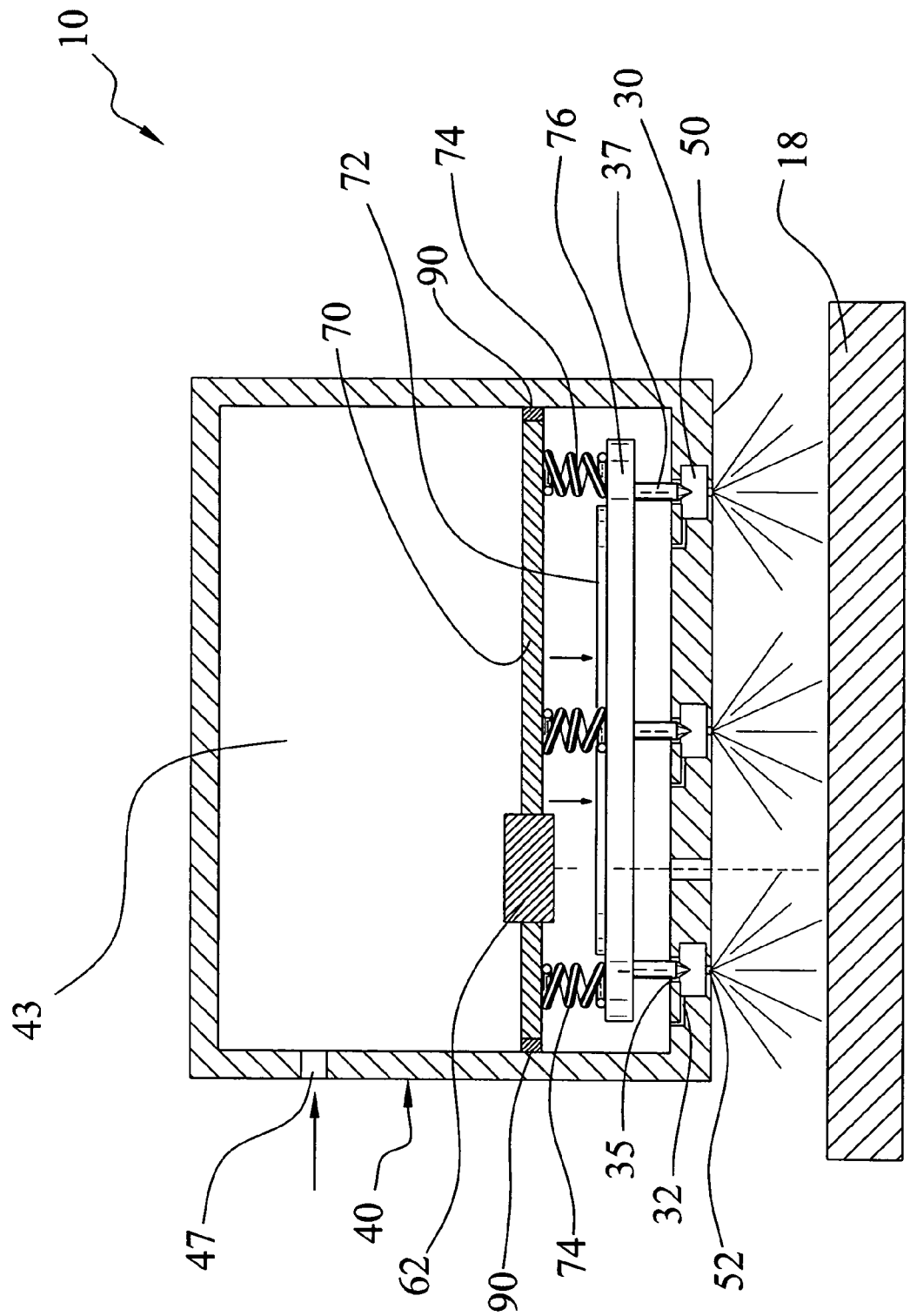
FIG. 8 is a side cutaway view of the spray unit with the plungers fully inserted within the corresponding main jets.
Figure 9:
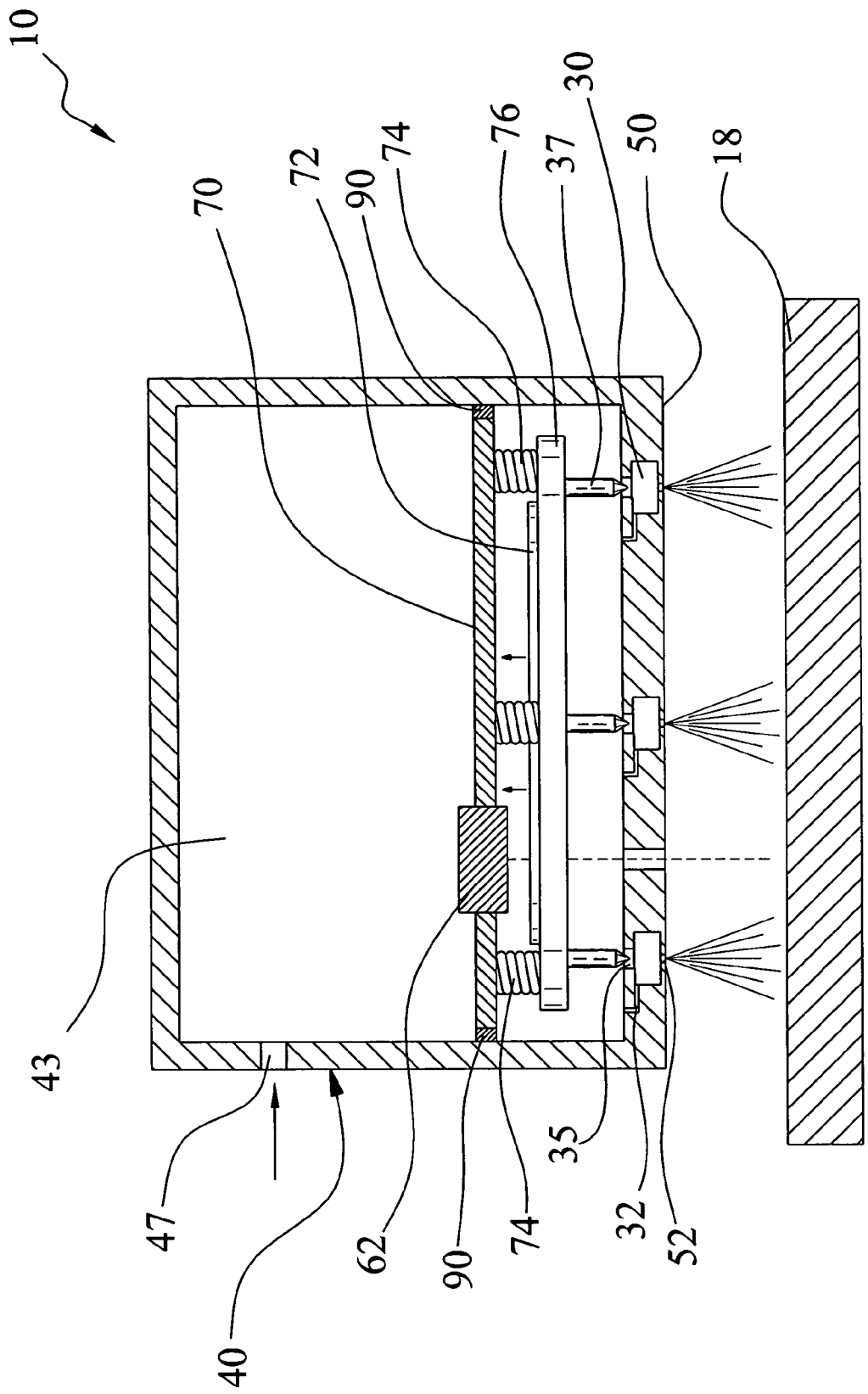
FIG. 9 is a side cutaway view of the spray unit with the plungers partially removed from the corresponding main jets.

In order to measure the temperature of the semiconductors 18 during testing, a temperature sensor 62 may be attached to each of the sockets 14, directly upon the semiconductors 18, embedded directly within the semiconductors 18, or positioned within the spray units 40. Devices for measuring the temperature of semiconductors 18 are commonly utilized within the burn-in industry that may be utilized with the present invention. Examples of suitable temperature sensors 62 include but are not limited to thermocouple, thermopile, electronic devices capable of inferring temperature of the semiconductor 18 from the semiconductor's power draw, or infrared devices. FIGS. 8 and 9 illustrate the usage of an infrared device for the temperature sensor 62 which detects the temperature of the semiconductor 18 through an aperture within the first portion 50 of the spray unit 40.

E. Spray Units

A plurality of spray units 40 may be organized within an array forming a spray assembly. The spray assembly preferably is comprised of a relatively flat structure, however various other structures may be utilized to construct the spray assembly. Each of the spray units 40 is preferably arranged upon the spray assembly corresponding to a specific socket 14 within the burn-in board 12. There may or may not be a pattern for the plurality of spray units 40 such as but not limited to a row pattern, or a staggered pattern.

Each of the spray units 40 includes a housing structure 42 having an interior housing cavity 43 covered by a rear plate or other similar structure. The rear plate may be attached to the housing structure 42 using various fastening devices. The housing structure 42 may have various sizes and shapes other than illustrated in the drawings. A first port 45 is fluidly connected within the housing structure 42 which fluidly corresponds to the main jet 35 and the swirl inlets 32 of the spray units 40.

Each of the spray units 40 has a first portion 50 containing one or more first orifices 52. The spray units 40 may be comprised of various movable components which are not shown in the attached drawings, but which may be easily adapted to utilize the present invention. The first portion 50 may have various shapes and structures for dispensing the fluid onto the semiconductor 18.

Figure 4:
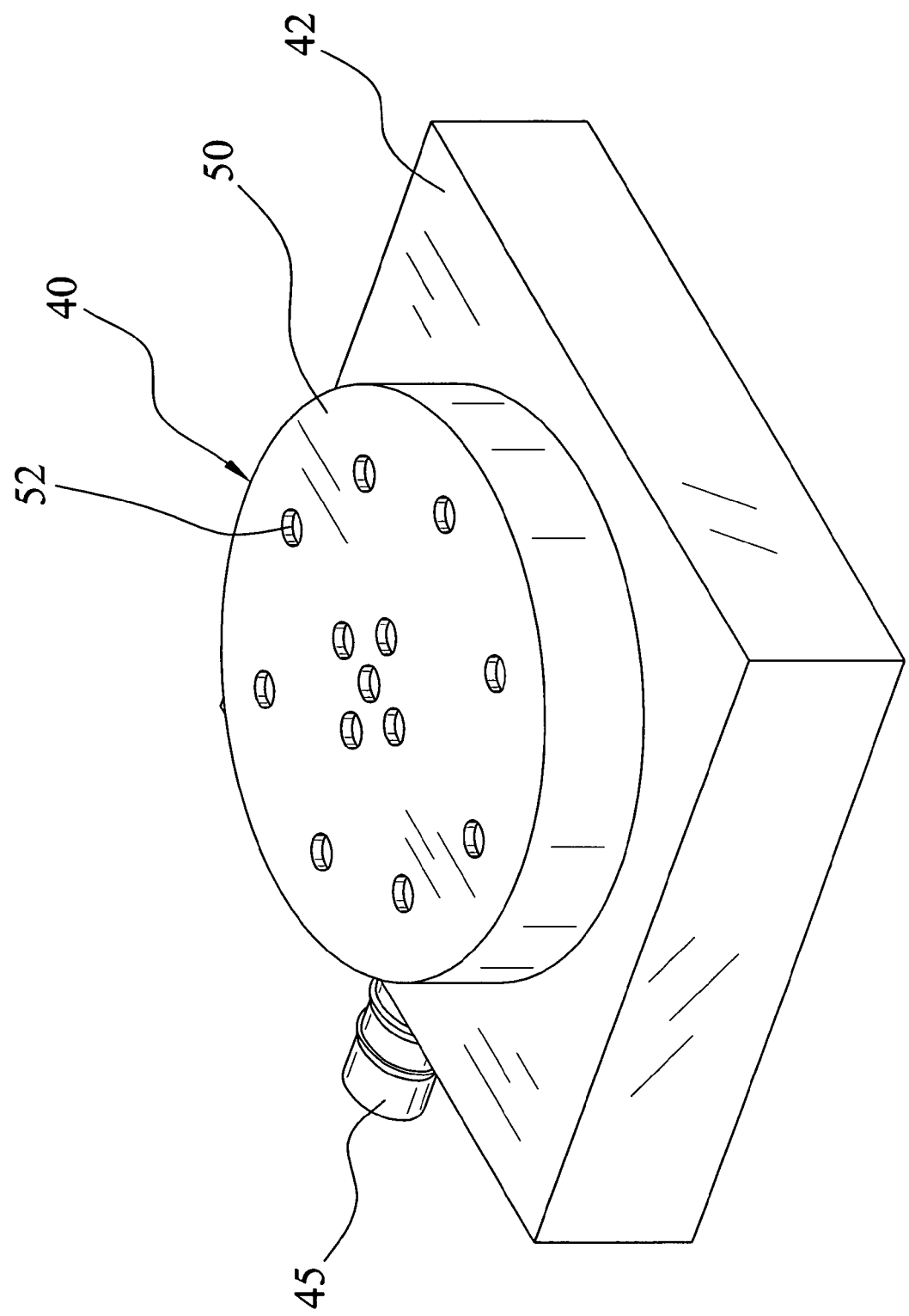
FIG. 4 is an upper perspective view of a spray unit.
Figure 5:
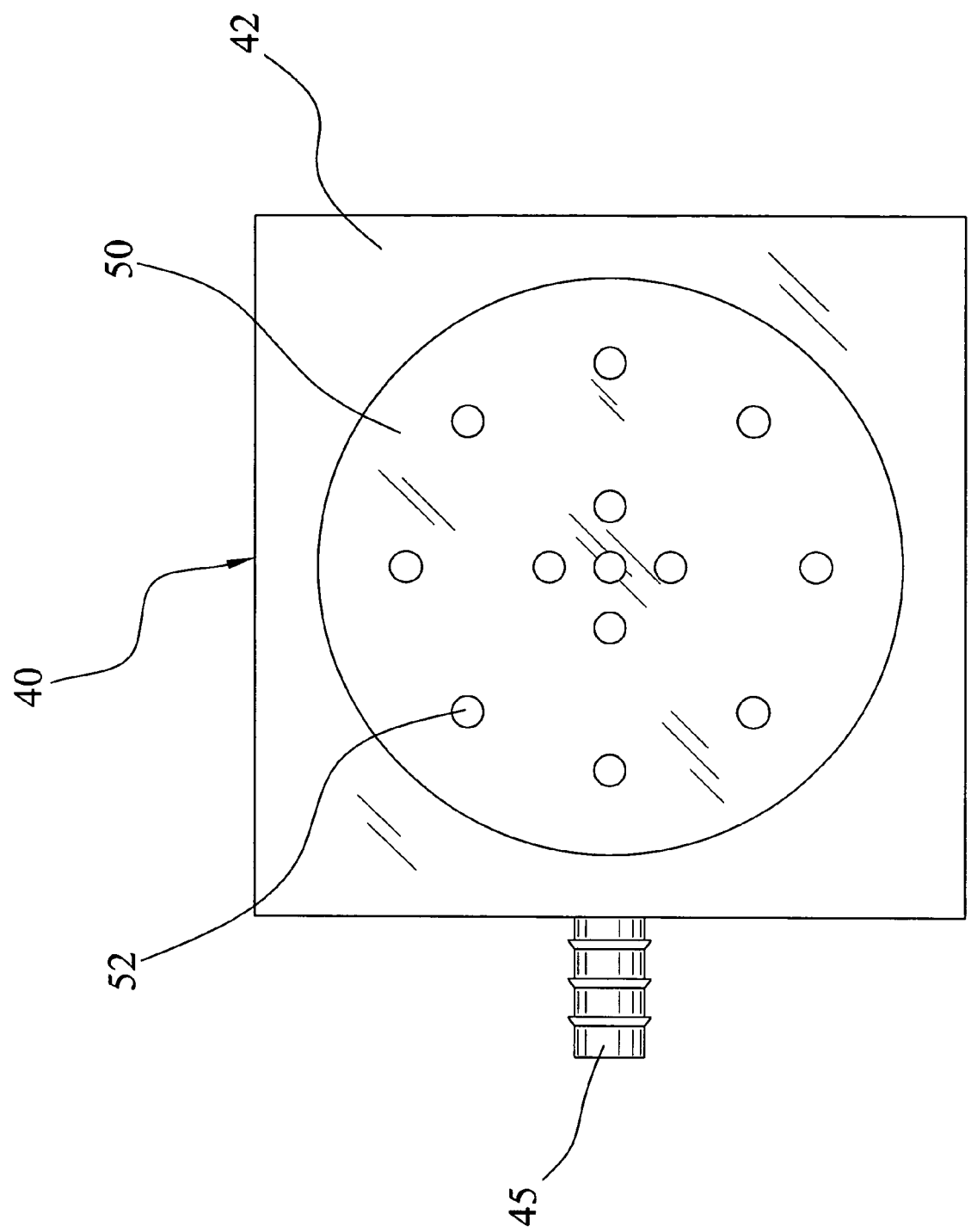
FIG. 5 is a top view of the spray unit.

One or more first orifices 52 extend through the first portion 50 in various patterns as best shown in FIGS. 4 and 5 of the drawings. The first orifices 52 may have various characteristics, shapes, sizes, styles, designs, arrangements and densities. The first orifices 52 may be arranged to provide various spray patterns amongst multiple orifices, or various cone angles from each individual first orifice 52, upon the semiconductor 18. Cone angles may be of the full cone variety as is known in the art, or of the hollow cone variety as is also known in the art, and may vary from 10° to 60°, but are not limited to varieties, or this angular range. The first orifices 52 provide an adjustable spray pattern depending upon the temperature and/or heat flux of the semiconductor 18 being tested. The first orifices 52 dispense the pressurized fluid from within the swirl chamber 30 as shown in FIGS. 6 through 9 of the drawings.

Dynamic spray cone angles are utilized dependent upon the thermal management requirements of the semiconductor 18. For example, if it is desirable to reduce the cooling of the semiconductor 18, one or more of the orifices 52 may be adjusted to reduce the surface area that is sprayed with the fluid by adjusting the spray cone angles in response to temperature feedback. Conversely, if it is desirable to increase the cooling of the semiconductor 18, one or more of the orifices 52 may be adjusted to increase the surface area that is sprayed with the fluid by adjusting the spray cone angles in response to temperature feedback. The orifices 52 could be aligned to correspond to high heat flux areas on the semiconductor 18.

The spray assembly may include a first inlet port that is fluidly connected to the housing cavity 43 and the swirl inlets 32 of the spray units 40. A first valve 84 preferably controls the fluid flow from an inlet tube to the first inlet port. The first port 45 within the spray units 40 receives the fluid flow from the first inlet port thereby providing the pressurized fluid to the housing cavity 43 of the spray units 40. The main jet 35 and the swirl inlets 32 preferably receive the pressurized fluid from the housing cavity 43 as best illustrated in FIGS. 8 and 9 of the drawings.

In an alternative embodiment, the swirl inlets 32 may receive the pressurized fluid from a different source than the main jet 35. In the alternative embodiment, a second valve may separately control the fluid flow from the inlet tube to a second inlet port within the spray unit 40. A second port within the spray unit 40 receives the fluid flow from the second inlet port for providing the pressurized fluid to the swirl inlets 32.

F. Dynamic Spray Control

Figure 6:
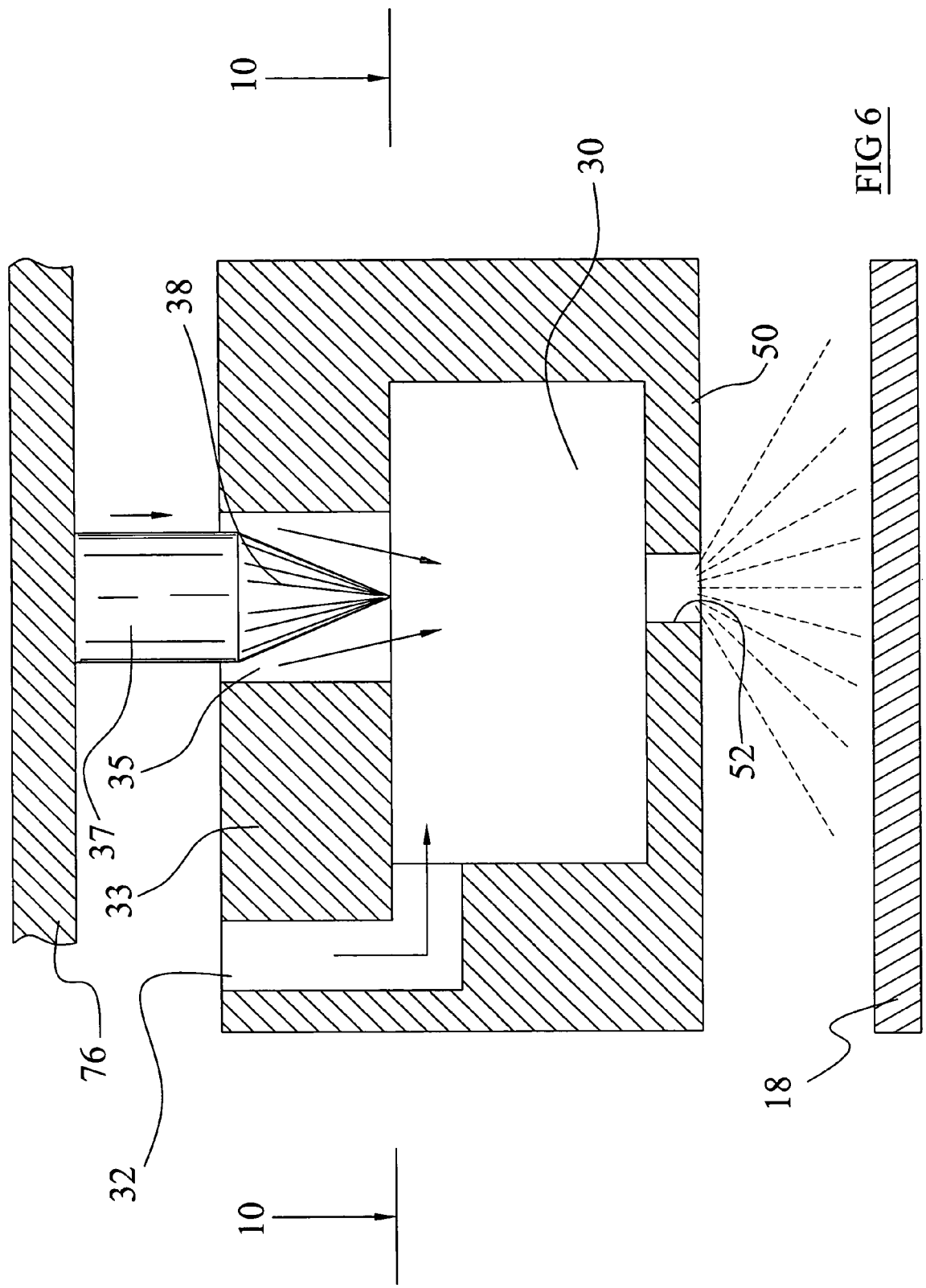
FIG. 6 is a side cutaway view of an individual swirl chamber with the plunger fully inserted within the main jet.
Figure 7:
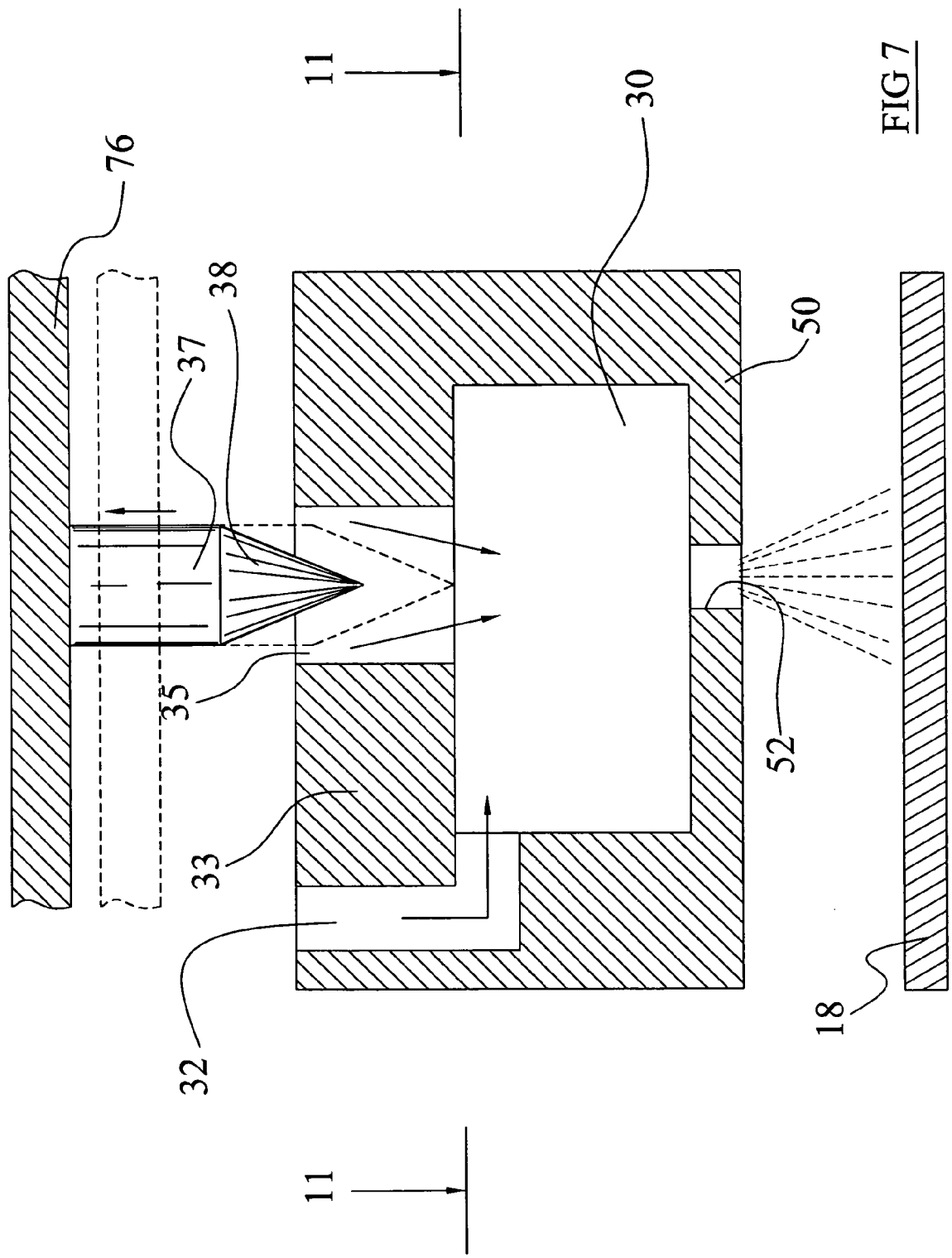
FIG. 7 is a side cutaway view of an individual swirl chamber with the plunger partially removed from the main jet.

FIGS. 6 through 9 of the drawings illustrate an exemplary dynamic spray control within the spray units 40. The dynamic spray control may be used for one or more of the first orifices 52. As shown in FIGS. 6 through 9, a swirl chamber 30 is positioned within the first portion 50 of the spray unit 40. The swirl chamber 30 is fluidly connected to the first orifice 52 as best illustrated in FIGS. 6 and 7 of the drawings.

The swirl chamber 30 preferably has a cylindrical interior with a circular cross section for facilitating the rotation of fluid within the swirl chamber 30. However, the swirl chamber 30 may have various other cross sectional shapes such as but not limited to square or oval. The swirl chamber 30 may have various sizes, interior heights and interior diameters.

Figure 12:
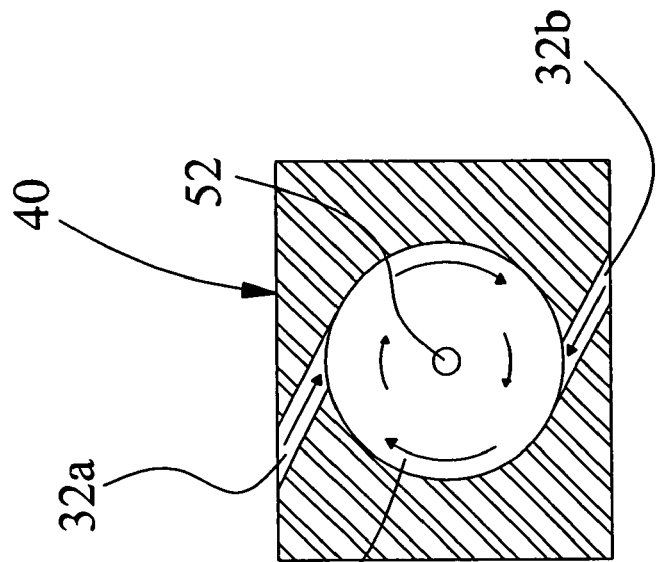
FIG. 12 is a cross sectional view of an embodiment of the present invention having more than one swirl inlet.
Figure 11:
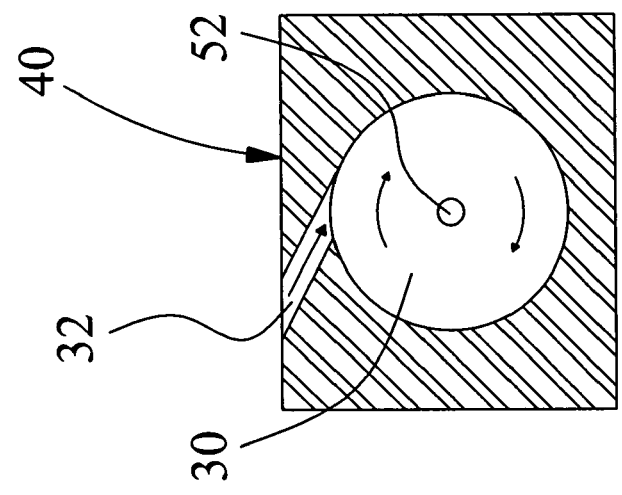
FIG. 11 is a cross sectional view taken along line 11-11 of FIG. 7.
Figure 10:
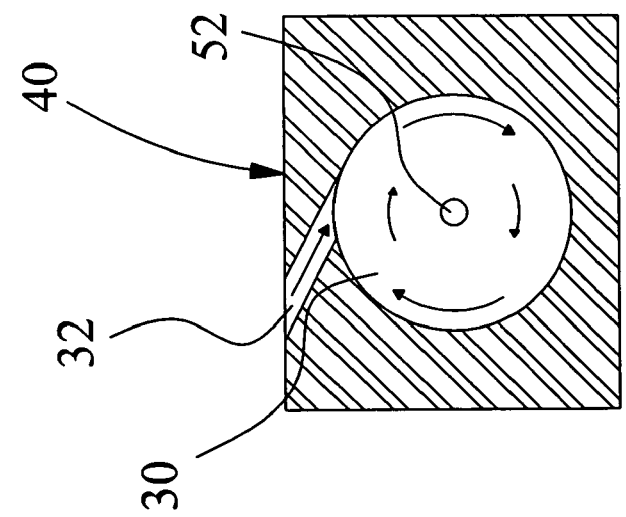
FIG. 10 is a cross sectional view taken along line 10-10 of FIG. 6.

As shown in FIGS. 6 through 12 of the drawings, one or more swirl inlets 32 are fluidly connected to the swirl chamber 30 for providing a fluid flow into the swirl chamber 30 relatively transverse with respect to the direction of spray from the first orifice 52. The swirl inlets 32 are preferably substantially tangential to the interior wall of the swirl chamber 30 as best illustrated in FIGS. 10 through 12 of the drawings. The swirl inlets 32 fluidly extend within the spray unit 40 and are preferably are fluidly connected to the housing cavity 43, or alternatively to a second port.

An inlet plate 33 partially surrounds the swirl chamber 30 opposite of the first orifice 52 as best illustrated in FIGS. 6 and 7 of the drawings. The inlet plate 33 may have various thicknesses, however it is preferable to maintain the thickness of the inlet plate 33 between 0.005-0.20 inches. A thicker inlet plate 33 provides increased control over the fluid flow as the length of the tapered portion 38 of the plunger 37 may be increased.

As best shown in FIGS. 6 and 7 of the drawings, a main jet 35 extends within the inlet plate 33 and fluidly connects the housing cavity 43 and the swirl chamber 30. The main jet 35 preferably has a constant inner diameter as best illustrated in FIGS. 6 and 7 of the drawings. However, tapered or varying structures may be utilized to construct the main jet 35. The main jet 35 preferably has a circular cross section, however various other cross sectional shapes may be utilized to construct the main jet 35 such as but not limited to square, rectangular and oval.

The main jet 35 is preferably aligned coaxially with the first orifice 52 as illustrated in FIGS. 6 and 7 of the drawings. However, the main jet 35 may be positioned offset with respect to an axis of the first orifice 52. Alternatively, more than one main jet 35 may extend through the inlet plate 33 into the swirl chamber 30.

As shown in FIGS. 6 and 7 of the drawings, a plunger 37 having a tapered portion 38 is movably positioned within the main jet 35. The plunger 37 controls the amount of fluid that flows through the main jet 35 based upon the position of the plunger 37 within the main jet 35. The tapered portion 38 preferably has a constant taper as illustrated in FIGS. 6 and 7, however the tapered portion 38 may have a varying tapered structure for providing various flow control. A stepped structure may also be utilized upon the distal portion of the plunger 37. In addition, a plunger 37 may be positioned within the swirl inlet 32 for controlling the fluid flow through the swirl inlet 32.

Various technologies may be utilized to control the position of the plunger 37 within the main jet 35 such as but not limited to digital stepper motors, linear actuators, magnetostrictive actuators or mechanical devices. In addition, each plunger 37 may be controlled individually or in a group by using a common mechanical or electrical structure by the control unit 60.

FIGS. 8 and 9 illustrate the usage of a main plate 70 secured within the housing cavity 43 of the spray unit 40 which allows for the passage of fluid through thereof through openings. A support plate 76 is connected to the main plate 70 by a biasing device such as but not limited to one or more springs 74 as further shown in FIGS. 8 and 9 of the drawings. A planar magnet 72 is attached to the support plate 76 with a magnetic coil 90 positioned within the spray unit 40 for generating a magnetic field that either repels or attracts the planar magnet 72 with respect thereto thereby causing the support plate 76 to move accordingly. The magnetic coil 90 is electrically connected to the control unit 60 which provides the electrical power required to generate the desired magnetic field. Various other actuator devices, which are commonly utilized in the electronics industry, may be utilized to manipulate the support plate 76.

One or more plungers 37 are connected to the support plate 76 in a non-movable manner as shown in FIGS. 6 through 9 of the drawings. The plungers 37 are manipulated within their respective main jet 35 as shown in FIGS. 8 and 9 of the drawings. It is preferable to have all of the plungers 37 within one or more spray units 40 to be connected to a single support plate 76 for providing a uniform manipulation of the plungers 37. However, the plungers 37 may be attached singularly and/or in groups to a support plate 76 within a spray unit 40 so as to provide diverse control of the spray pattern emitted from the first orifices 52.

Alternatively, moving the inlet plate 33 and the first portion 50 with respect to the plunger 37 positioned in a stationary position may be utilized instead of moving the plunger 37. Various other devices may be utilized to control the flow of fluid into the swirl chamber 30 and thereby control the characteristics of the fluid spray dispersed from the first orifice 52. A piezo-crystal or magnetostrictive material positioned between the inlet plate 33 and the walls of the swirl chamber 30 may be utilized to manipulate the position of the inlet plate 33 without the usage of a plunger 37 which disrupts the rotation of the fluid within the swirl chamber 30.

As the fluid flows into the swirl chamber 30 from the main jet 35, the fluid is combined with fluid flowing into the swirl chamber 30 transversely from one or more swirl inlets 32 creating a swirling rotation effect within the swirl chamber 30. Increased rotation of the fluid within the swirl chamber 30 provides for increased atomization of the fluid upon being dispersed through the first orifice 52 and a larger spray pattern.

Relatively low fluid flow through the main jet 35 with respect to the swirl inlet 32 allows for increased rotation of the fluid within the swirl chamber 30 that increases the size and angle of the spray pattern as illustrated in FIGS. 6, 8 and 10 of the drawings. Relatively high fluid flow through the main jet 35 with respect to the swirl inlet 32 allows for decreased rotation of the fluid within the swirl chamber 30 thereby decreasing the size and angle of the spray pattern as illustrated in FIGS. 7, 9 and 11 of the drawings. By controlling the relative flow rate of fluid entering the swirl chamber 30 from the swirl inlet 32 and the main jet 35, the spray pattern is controllable as desired.

As the plunger 37 is retracted from the main jet 35, an increased flow rate of the fluid is provided to the swirl chamber 30 thereby reducing the amount of rotation of the fluid within the swirl chamber 30 as shown in FIGS. 7 and 9 of the drawings. The main jet 35 and the plunger 37 may be sized such that when the plunger 37 is fully retracted from the main jet 35, a relatively straight jet of fluid passes through the first orifice 52 instead of an atomized spray. As the plunger 37 is extended into the main jet 35, a decreased flow rate of the fluid is provided to the swirl chamber 30 thereby increasing the amount of rotation of the fluid within the swirl chamber 30 that occurs because of the swirl inlet 32 as shown in FIGS. 6 and 8 of the drawings.

G. Fluid Distribution System

The reservoir 80 is comprised of a container structure capable of retaining a desired volume of fluid. The reservoir 80 may have various shapes, sizes and structures which are commonly utilized to construct a reservoir 80. The fluid utilized within the present invention is preferably comprised of a dielectric fluid such as but not limited to hydrofluoroether (HFE). However, the fluid utilized may be comprised of a non-dielectric such as but not limited to water.

The reservoir 80 may include a thermal conditioning unit 66 for increasing or decreasing the temperature of the fluid within the reservoir 80 to a desired temperature to be sprayed upon the semiconductors 18 during the burn-in process. The thermal conditioning unit 66 may be comprised of a combination heater unit and cooling unit. A heat exchanger may be utilized to increase the temperature of the fluid within the reservoir 80 by exchanging the heat from the fluid returning from the spray enclosure 20 after spraying upon the semiconductors 18. An inline heater/cooler may also be utilized to thermally condition the fluid prior to or after spraying from the nozzles.

A main pump 82 is fluidly connected to the reservoir 80 for drawing the dielectric fluid from within the reservoir 80. The fluid pressure within the fluid distribution system may be maintained by operation of the main pump 82 and/or a return valve 85 which allows for the return of fluid to the reservoir 80 to lower the fluid pressure as shown in FIG. 1 of the drawings. Various other pressure regulating devices may be utilized to control the fluid pressure on the pressurized side of the pump. The main pump 82 is fluidly connected to the first valve 84 as further illustrated in FIG. 1 of the drawings thereby providing pressurized fluid to the spray units 40 at the desired pressure. Alternatively, if a second fluid source is connected to the swirl inlets 32, a second valve may be fluidly connected to the main pump 82.

As shown in FIG. 1 of the drawings, a fluid collector 28 is positioned within the spray enclosure 20 for collecting the fluid after being sprayed upon the semiconductors 18. The fluid collector 28 may be comprised of various collecting devices such as but not limited to a pan structure. The fluid collector 28 is fluidly connected to the reservoir 80 for returning the used fluid to the reservoir 80. A filter device may be positioned within the fluid collector 28 or the reservoir 80 for filtering the fluid after being sprayed upon the semiconductors 18 for removing undesirable particulate materials and chemicals which might interfere with the operation of the spray units 40.

A vapor recovery unit 70 may be fluidly connected to or within the spray enclosure 20 for collecting and condensing fluid that has undergone a phase change to vapor. The vapor recovery unit 70 may be comprised of condensing coils and similar other devices capable of condensing vapor. The vapor recovery unit 70 may be utilized during and after the burn-in process.

H. Control Unit

The control unit 60 may be comprised of various electronic devices capable of communicating with and controlling the burn-in board 12, the thermal conditioning unit 66, the main pump 82, the first valve 84, the second valve, the return valve 85 and the vapor recovery unit 70. The control unit 60 may be comprised of a computer or other electronic device capable of receiving, storing and transmitting commands. The control unit 60 may be powered via various conventional electrical power sources.

The control unit 60 may communicate with the external electrical devices such as but not limited to electrically or via communications signal. The control unit 60 may be programmed to operate the external devices at various operating levels such as but not limited to controlling the temperature of the fluid within the reservoir 80, controlling the fluid pressure and flow rate emitted by the main pump 82, controlling the spray pattern and flow of the first orifices 52, and controlling the flow of fluid to the spray unit 40. It can be appreciated that more than one control unit 60 may be utilized to control one or more of the components of the present invention.

I. Operation

In use, the semiconductors 18 are properly positioned within the sockets 14 of the burn-board 12. The burn-in board 12 is then positioned within the spray enclosure 20 with the surface of the semiconductors 18 facing substantially toward the corresponding spray units 40. The dielectric fluid within the reservoir 80 is heated to a desired temperature for cooling or heating the semiconductors 18 with or without using a conditioning unit 90. The main pump 82 and first valve 84 may be utilized to achieve and maintain the target junction temperature even though the fluid temperature may not be the desired temperature. The main pump 82 is operated to provide the pressurized fluid to the spray assembly.

Figure 3:
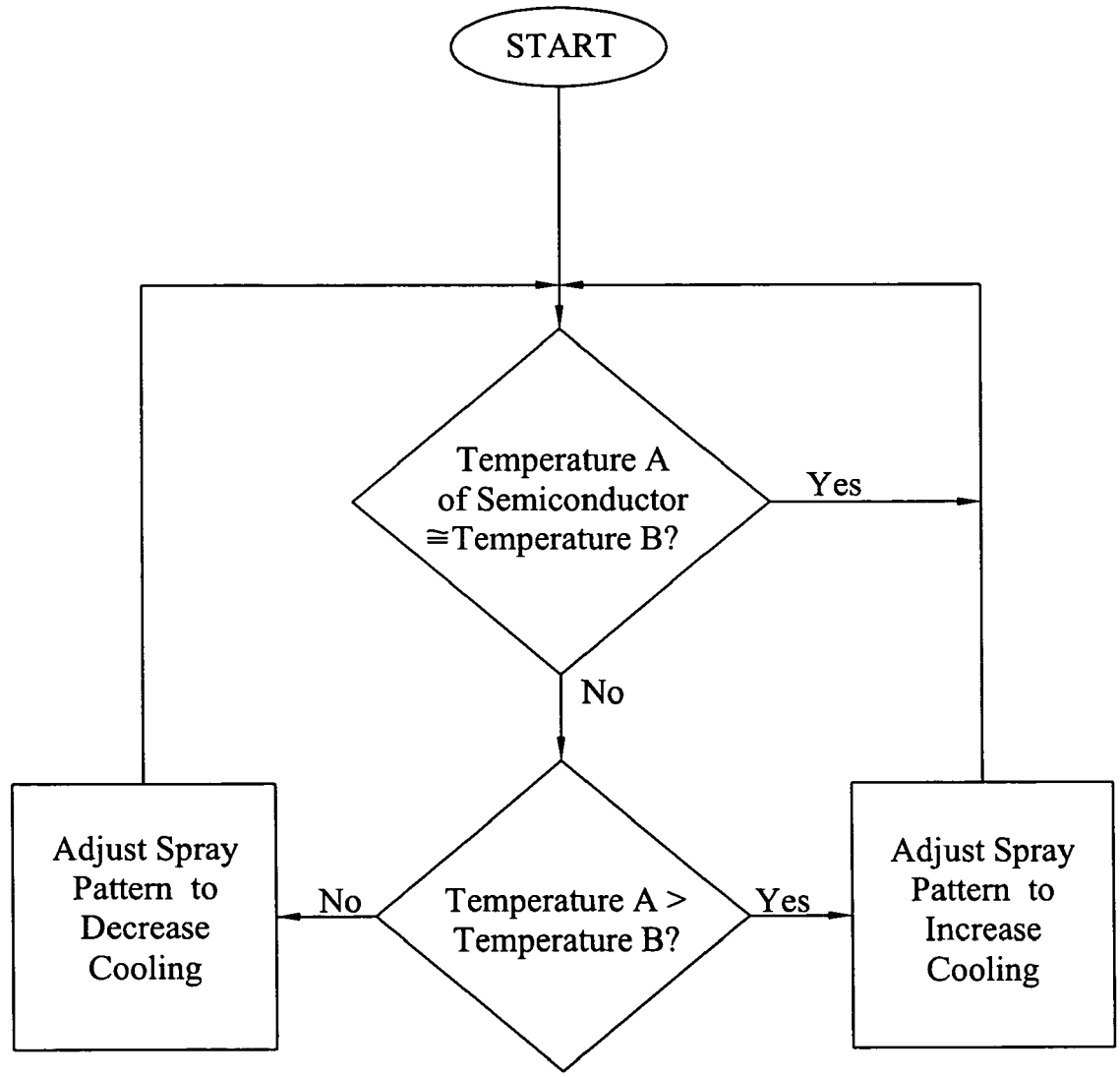
FIG. 3 is a flowchart illustrating the overall operation of the present invention.

As the fluid is sprayed upon the semiconductor 18, the control unit 60 applies the desired voltage to the semiconductors 18 through the burn-in board 12 for burn-in testing purposes thereby increasing or lowering the temperature of the semiconductor 18. If the temperature A of the semiconductor 18 rises above a desired temperature B (e.g. 100° Celsius), then the flow rate X of the fluid may be increased to the spray units 40. In addition to or independent of increasing the flow rate X, the spray pattern size emitted from one or more of the first orifices 52 may be increased to engage an increased surface area of the semiconductor 18 of the semiconductor thereby increasing the cooling of the semiconductor 18 as shown in FIG. 3 of the drawings.

If the temperature A of the semiconductor 18 is lowered below a desired temperature B, then the flow rate X of the fluid may be decreased to the spray units 40. In addition to or independent of decreasing the flow rate X, the spray pattern size emitted from one or more of the first orifices 52 may be decreased to engage a reduced surface area of the semiconductor 18 thereby reducing the cooling of the semiconductor 18 as shown in FIG. 3 of the drawings. In addition, the spray pattern may be increased in size thereby reducing the volume of spray engaging high heat flux areas of the semiconductor 18.

If the temperature A of the semiconductor 18 is approximately equal to a desired temperature B, then the flow rate X of the fluid is preferably maintained to the spray units 40. In addition, the spray pattern size is preferably maintained relatively constant for each of the first orifices 52 where the temperature A of the semiconductor 18 is approximately equal to the desired temperature B.

In order to control the temperature A of the semiconductor 18, the power level may also be increased or lowered independently or in conjunction with the control of the fluid flow rate. The AC and DC power levels may be adjusted to manipulate the semiconductor's temperature.

This process continues until the semiconductors 18 are fully burned-in over the required amount of time. Once the burn-in process is completed, the flow of the fluid is terminated. All vapor is recovered during the fluid recovery phase, and unevaporated coolant on the burn-in board 12, sockets and other, is made to evaporate for subsequent recovery. The burn-in board 12 and semiconductors 18 are then removed from the spray enclosure 20 for replacement with other burn-in boards 12 and semiconductors 18.

As to a further discussion of the manner of usage and operation of the present invention, the same should be apparent from the above description. Accordingly, no further discussion relating to the manner of usage and operation will be provided.

With respect to the above description then, it is to be realized that the optimum dimensional relationships for the parts of the invention, to include variations in size, materials, shape, form, function and manner of operation, assembly and use, are deemed to be within the expertise of those skilled in the art, and all equivalent structural variations and relationships to those illustrated in the drawings and described in the specification are intended to be encompassed by the present invention.

In addition, the present invention should not be limited to solely semiconductor burn-in applications or electronic device thermal management applications as the technology is suitable for various other applications not related to thermal management of electronic devices such as but not limited to the application of a liquid to a surface of an object. Therefore, the foregoing is considered as illustrative only of the principles of the invention. Further, since numerous modifications and changes will readily occur to those skilled in the art, it is not desired to limit the invention to the exact construction and operation shown and described, and accordingly, all suitable modifications and equivalents may be resorted to, falling within the scope of the invention.

I claim:

1. A dynamic spray cooling system for thermally managing a heat producing device, comprising:
   a spray unit including an adjustable orifice, wherein said spray unit discharges a continuous coolant spray having an adjustable spray characteristic; and
   a control unit in communication with said spray unit, wherein said control unit transmits a control signal to said spray unit for adjusting said adjustable spray characteristic of said continuous coolant spray;
   wherein said control signal is dependent upon a feedback data said control unit receives from said spray unit;
   wherein said feedback data includes a measured temperature of a heat producing device being thermally managed.

2. The dynamic spray cooling thermal management system of claim 1, wherein said spray characteristic includes a flow rate.

3. The dynamic spray cooling thermal management system of claim 1, wherein said spray characteristic includes a spray pattern.

4. The dynamic spray cooling thermal management system of claim 1, wherein said spray unit includes a swirl chamber and a swirl inlet.

5. The dynamic spray cooling thermal management system of claim 1, wherein said adjustable orifice is comprised of a discharge orifice.

6. The dynamic spray cooling thermal management system of claim 1, wherein said adjustable orifice is comprised of an inlet orifice fluidly connected to a swirl chamber within said spray unit.

7. A dynamic spray cooling system for thermally managing a heat producing device, comprising:
   an atomizer including an adjustable orifice, wherein said atomizer discharges a continuous coolant spray having an adjustable spray characteristic; and
   a control unit in communication with said atomizer, wherein said control unit transmits a control signal to said atomizer for adjusting said adjustable spray characteristic of said continuous coolant spray;
   wherein said control signal is dependent upon a feedback data said control unit receives from said atomizer;
   wherein said feedback data includes a measured temperature of a heat producing device being thermally managed.

8. The dynamic spray cooling thermal management system of claim 7, wherein said spray characteristic includes a flow rate.

9. The dynamic spray cooling thermal management system of claim 7, wherein said spray characteristic includes a spray pattern.

10. The dynamic spray cooling thermal management system of claim 7, wherein said atomizer includes a swirl chamber and a swirl inlet.

11. The dynamic spray cooling thermal management system of claim 7, wherein said adjustable orifice is comprised of a discharge orifice.

12. The dynamic spray cooling thermal management system of claim 7, wherein said adjustable orifice is comprised of an inlet orifice fluidly connected to a swirl chamber within said atomizer.

13. A dynamic spray cooling system for thermally managing a heat producing device, comprising:
   a heat producing device;
   a spray unit, wherein said spray unit discharges a continuous coolant spray having an adjustable spray characteristic toward said heat producing device to thermally manage said heat producing device; and
   a control unit in communication with said spray unit, wherein said control unit transmits a control signal to said spray unit for adjusting said adjustable spray characteristic of said continuous coolant spray.

14. The dynamic spray cooling thermal management system of claim 13, wherein said control signal is dependent upon a feedback data said control unit receives from said heat producing device.

15. The dynamic spray cooling thermal management system of claim 14, wherein said feedback data includes a measured temperature of said heat producing device being thermally managed.

16. The dynamic spray cooling thermal management system of claim 13, wherein said spray characteristic includes a flow rate.

17. The dynamic spray cooling thermal management system of claim 13, wherein said spray characteristic includes a spray pattern.

18. The dynamic spray cooling thermal management system of claim 13, wherein said spray unit includes a swirl chamber and a swirl inlet.

* * * * *